(12) United States Patent
Wu et al.

(10) Patent No.: US 9,088,290 B2
(45) Date of Patent: Jul. 21, 2015

(54) LC OSCILLATOR PROCESS COMPENSATION CIRCUIT

(71) Applicant: IPGoal Microelectronics (Sichuan) Co., Ltd., Chengdu (CN)

(72) Inventors: Zhaolei Wu, Chengdu (CN); Zhengxian Zou, Chengdu (CN)

(73) Assignee: IPGOAL MICROELECTRONICS (SICHUAN) CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/457,802

(22) Filed: Aug. 12, 2014

(65) Prior Publication Data
US 2015/0102867 A1    Apr. 16, 2015

(30) Foreign Application Priority Data

Oct. 11, 2013   (CN) .......................... 2013 1 0473252

(51) Int. Cl.
| | |
|---|---|
| *H03B 5/08* | (2006.01) |
| *H03L 7/06* | (2006.01) |
| *H03B 1/00* | (2006.01) |
| *H03L 7/099* | (2006.01) |

(52) U.S. Cl.
CPC .. *H03L 7/06* (2013.01); *H03B 1/00* (2013.01); *H03L 7/099* (2013.01)

(58) Field of Classification Search
CPC .................................. H03L 7/099; H03B 1/00
USPC ................. 331/186, 185, 167, 117 R, 117 FE
See application file for complete search history.

(56) References Cited

U.S. PATENT DOCUMENTS 6,943,637 B2 *   9/2005   Ruffieux ................. 331/117 FE

* cited by examiner

*Primary Examiner* — Arnold Kinkead
(74) *Attorney, Agent, or Firm* — Shimokaji & Associates, P.C.

(57) ABSTRACT

An LC oscillator process compensation circuit includes an LC oscillator, a reference voltage terminal, a follower and a current auxiliary circuit, the LC oscillator includes a gain stage, an inductor and two voltage-controlled capacitors, the gain stage includes a first Field Effect Transistor, a second Field Effect Transistor, a third Field Effect Transistor and a fourth Field Effect Transistor, the current auxiliary circuit is connected with an external power source and the follower that connected with the reference voltage terminal to provide a working voltage for the LC oscillator, the follower includes a detection circuit to detecting current changes of the gain stage. The LC oscillator process compensation circuit has simple circuit structure and eliminates frequency changes of the LC oscillator caused by the process variations of the gain stage, thereby ensuring stability of the frequency of the LC oscillator, improving work precision and reducing design difficult.

15 Claims, 1 Drawing Sheet

LC OSCILLATOR PROCESS COMPENSATION CIRCUIT

RELATED APPLICATIONS

This application claims the benefit of priority to Chinese Patent Application No. 201310473252.1, filed on Oct. 11, 2013, which is hereby incorporated by reference in its entirety.

FIELD OF THE INVENTION

The present invention relates to a technical field of integrated circuits, more specifically to an LC oscillator process compensation circuit.

BACKGROUND OF THE INVENTION

Clock generation circuit is an important part of the integrated circuit design. As known, external crystals or crystal oscillators used in the circuit can provide an accurate clock source, however, manufacturing cost of the system is increased. Therefore it's necessary to develop an accurate on-chip clock generation circuit. In traditional on-chip high speed clock generation circuits, an LC oscillator is used to obtain a clock with good noise performance, and voltage-controlled capacitors are usually used in the standard CMOS process. Besides, since the LC oscillator is an open-loop design, it usually uses configurable modes to compensate deviation of the clock frequency caused by process variations, and gets a wanted clock frequency by controlling the voltage across the voltage-controlled capacitor to change its capacitance absolute value.

FIG. 1 is a frame diagram of an existing LC oscillator process compensation circuit, as shown is FIG. 1, the existing LC oscillator process compensation circuit includes an LC oscillator, a voltage regulator LDO, and a reference voltage terminal which is arranged for generating a reference voltage vref1. Concretely, two input terminals of the voltage regulator LDO are connected with the reference voltage terminal and an external power source vdd1 respectively, and an output terminal of the voltage regulator LDO is connected with the LC oscillator, thus the voltage regulator LDO outputs a stable voltage reg1 to the LC oscillator, thereby making it works normally. The LC oscillator includes a gain stage, an inductor L1 and two voltage-controlled capacitors C11 and C12, and the gain stage includes a first Field Effect Transistor M11, a second Field Effect Transistor M12, a third Field Effect Transistor M13 and a fourth Field Effect Transistor M14. Concretely, the first Field Effect Transistor M11 and the second Field Effect Transistor M12 are P-type Field Effect Transistors, and have the same width/length (W/L) ratio; the third Field Effect Transistor M13 and the fourth Field Effect Transistor M14 are N-type Field Effect Transistors, and have the same W/L ratio; the gain stage has two voltage output terminals to output voltage von1 and voltage von2 respectively and correspondingly, and each voltage output terminal is connected with a voltage-controlled capacitor, the inductor L1 is connected between the two voltage output terminals. Specific connections of the above components are showed in FIG. 1, which are not described in detail.

In the above conventional circuit configuration, the voltage difference between two terminals of the voltage-controlled capacitor C11 is von1, and the voltage difference between two terminals of the voltage-controlled capacitor C12 is vop1. When the circuit works normally, a formula related to voltage and current of the Field Effect Transistor is:

$$I = \frac{1}{2} \cdot \mu \cdot C_{ox} \cdot \frac{W}{L} \cdot (V_{GS} - V_{TH})^2,$$

wherein $\mu$ refers to an electron mobility, more specifically refers to $\mu_n$ for N-type Field Effect Transistors, and refers to $\mu_p$ for P-type Field Effect Transistors; $C_{ox}$ refers to a gate oxide capacitance per unit area;

$$\frac{W}{L}$$

refers to the width/length ratio of the Field Effect Transistor; $V_{GS}$ refers to a voltage difference between the gate and source of the Field Effect Transistor; $V_{TH}$ refers to a threshold voltage of the Field Effect Transistor, more specifically refers to $V_{THN}$ for N-type Field Effect Transistors and refers to $V_{THP}$ for P-type Field Effect Transistors.

In addition, if set a variable $$K = \mu \cdot C_{ox} \cdot \frac{W}{L},$$

then:

$$K_{PM11} = \mu_p \cdot C_{ox} \cdot \left(\frac{W}{L}\right)_{PM11};$$

$$K_{PM12} = \mu_p \cdot C_{ox} \cdot \left(\frac{W}{L}\right)_{PM12};$$

$$K_{NM13} = \mu_n \cdot C_{ox} \cdot \left(\frac{W}{L}\right)_{NM13};$$

$$K_{NM14} = \mu_n \cdot C_{ox} \cdot \left(\frac{W}{L}\right)_{NM14}$$

According to the size of the Field Effect Transistors mentioned above:

$$\left(\frac{W}{L}\right)_{PM11} = \left(\frac{W}{L}\right)_{PM12}$$

$$\left(\frac{W}{L}\right)_{NM13} = \left(\frac{W}{L}\right)_{NM14}, \text{ and}$$

$$\frac{\mu_p}{\mu_n} = \frac{\left(\frac{W}{L}\right)_{NM13}}{\left(\frac{W}{L}\right)_{PM11}} = \frac{\left(\frac{W}{L}\right)_{NM14}}{\left(\frac{W}{L}\right)_{PM12}}$$

thereby:

$$K_{PM11} = K_{NM13} = K_{PM12} = K_{NM14}$$

When calculating DC operating points for the LC oscillator process compensation circuit, the resistance of the inductor L1 is small, the two voltage output terminals are shorted, the first Field Effect Transistor and the second Field Effect Transistor are connected in parallel to form a diode connection, and the third Field Effect Transistor and the fourth Field Effect Transistor are connected in parallel to form a diode connection. During the normal work, $$I_{PM11} = \frac{1}{2} \cdot K_{PM11}(V_{GS\_PM11} - V_{THP})^2; \quad (1)$$

$$I_{PM12} = \frac{1}{2} \cdot K_{PM12}(V_{GS\_PM12} - V_{THP})^2$$

$$I_{NM13} = \frac{1}{2} \cdot K_{NM13}(V_{GS\_NM13} - V_{THN})^2; \quad (2)$$

$$I_{NM14} = \frac{1}{2} \cdot K_{NM14}(V_{GS\_NM14} - V_{THN})^2$$

$$V_{GS\_PM11} + V_{GS\_NM13} = V_{GS\_PM12} + V_{GS\_NM14} = reg1 \quad (3)$$

$$I_{NM13} = I_{PM11}; I_{NM14} = I_{PM12} \quad (4)$$

Put the formulas (1), (2), (3) into the formula (4), then it can be obtained:

$$V_{GS\_NM13} = \frac{reg1 - V_{THP} + V_{THN}}{2}$$

$$V_{GS\_NM14} = \frac{reg1 - V_{THP} + V_{THN}}{2}$$

The voltage (including the voltage von1 and the voltage vop1) across the voltage-controlled capacitors C11 and C12 are $V_{GS\_NM13}$ and $V_{GS\_NM14}$ respectively, and it can be seen from above formulas that the voltage von1 and the voltage vop1 are related to the threshold voltage of the N-type Field Effect Transistors and the threshold voltage of the P-type Field Effect Transistors. Furthermore, changes of the Field Effect Transistors with the process should be considered in actual manufacturing. And since the process of the N-type Field Effect Transistors and the process of the P-type Field Effect Transistors are not changed simultaneously, so the circuit design should be verified in TT, SS, FF, SF and FS (T represents a standard process corner, S represents a slow process corner, F represents a fast process corner, and N-type Field Effect Transistors are in front with P-type Field Effect Transistors falling behind) process corners for the purpose of covering the entire process changes. From the above results, in the FS and SF process corners, the changes of the voltage von1 and the voltage vop1 are greatest; moreover, in the FS process corner, $V_{THN}=120\% \cdot V_{THP}$, and in the SF process corner, $V_{THN}=80\% \cdot V_{THP}$, thus in the FS and SF process corners, the voltage von1 and the voltage vop1 respectively as follows:

$$V_{GS\_NM13} = V_{GS\_NM14} = \frac{reg1 - V_{THP} + V_{THN}}{2} = \frac{reg1}{2} - \frac{20\% \cdot V_{THP}}{2}$$

$$V_{GS\_NM13} = V_{GS\_NM14} = \frac{reg1 - V_{THP} + V_{THN}}{2} = \frac{reg1}{2} + \frac{20\% \cdot V_{THP}}{2}$$

Since capacitance value of the voltage-controlled capacitors C11 and C12 vary with the voltage von1 and the voltage vop1, so in the FS and SF process corners, the frequency of the LC oscillator will deviate from the design value in the TT process corner, which causes an unstable frequency of the LC oscillator, and makes it difficult to guarantee the working accuracy.

Therefore, it is necessary to provide an improved LC oscillator process compensation circuit to overcome the above drawbacks.

SUMMARY OF THE INVENTION

An objective of the present invention is to provide an LC oscillator process compensation circuit which has simple circuit structure, and eliminates the frequency changes of the LC oscillator caused by the process variations of the gain stage in the LC oscillator, thereby ensuring stability of the frequency of the LC oscillator, improving work precision of the LC oscillator, and reducing design difficulty of the LC oscillator.

To achieve the objective, an LC oscillator process compensation circuit includes an LC oscillator, a reference voltage terminal, a follower and a current auxiliary circuit, and the LC oscillator includes a gain stage, an inductor and two voltage-controlled capacitors, the gain stage includes a first Field Effect Transistor, a second Field Effect Transistor, a third Field Effect Transistor and a fourth Field Effect Transistor, having two voltage output terminals each of which is connected with a voltage-controlled capacitor, the inductor is connected between the two voltage output terminals, the current auxiliary circuit is connected with an external power source and the follower respectively, arranged for providing a working current for the follower which is further connected with the reference voltage terminal, the follower is arranged for providing a working voltage for the LC oscillator, and the follower further includes a detection circuit which is arranged for detecting current changes of the gain stage.

Preferably, the detection circuit comprises an eighth Field Effect Transistor and a ninth Field Effect Transistor, and a source of the eighth Field Effect Transistor is connected with the source of the fifth Field Effect Transistor and the drain of the first Field Effect Transistor respectively, gates and drains of the eighth Field Effect Transistor and the ninth Field Effect Transistor are jointly connected to the gate of the seventh Field Effect Transistor, and a source of the ninth Field Effect Transistor is grounded.

Preferably, the third Field Effect Transistor, the fourth Field Effect Transistor, the fifth Field Effect Transistor, the seventh Field Effect Transistor, and the ninth Field Effect Transistor are N-type Field Effect Transistors; the first Field Effect Transistor, the second Field Effect Transistor, the sixth Field Effect Transistor and the eighth Field Effect Transistor are P-type Field Effect Transistors.

Preferably, the width/length ratio of the first Field Effect Transistor is the same as that of the second Field Effect Transistor, the width/length ratio of the sixth Field Effect Transistor is the same as that of the eighth Field Effect Transistor, and the width/length ratio of the sixth Field Effect Transistor is N times to that of the first Field Effect Transistor; the width/length ratio of the third Field Effect Transistor is the same as that of the fourth Field Effect Transistor, the width/length ratio of the ninth Field Effect Transistor is the same as that of the seventh Field Effect Transistor, and the width/length ratio of the ninth Field Effect Transistor is N times to that of the third Field Effect Transistor; and N is a positive integer.

Preferably, the width/length ratio of the fifth Field Effect Transistor is the sum of the width/length ratio of the third Field Effect Transistor, the fourth Field Effect Transistor and the ninth Field Effect Transistor.

Preferably, the current auxiliary circuit comprises a first current source and a second current source, and one terminal of the first current source is connected with the external power source, the other terminal of the first current source is connected with the gate of the fifth Field Effect Transistor and the source of the sixth Field Effect Transistor respectively; one terminal of the second current source is connected with the external power source, and the other terminal of the second current source is connected with the drain of the fifth Field Effect Transistor.

Preferably, the current auxiliary circuit comprises a first resistor and a second resistor, and one terminal of the first resistor is connected with the external power source, the other terminal of the first resistor is connected with the gate of the fifth Field Effect Transistor and the source of the sixth Field Effect Transistor respectively; one terminal of the second resistor is connected with the external power source, and the other terminal of the second resistor is connected with the drain of the fifth Field Effect Transistor.

In comparison with the prior art, the circuit structure of the LC oscillator process compensation circuit according to the present invention is simple. And when the process of the N-type and P-type Field Effect Transistors in the gain stage changes, the detection circuit detects the current changes in the gain stage and feeds them back to the follower, and then the voltage of the follower will be changed to compensate the changes of the voltage outputted from the voltage output terminals caused by the gain stage, so as to eliminate the frequency changes of the LC oscillator caused by the process variations of the gain stage in the LC oscillator, thereby ensuring stability of the frequency of the LC oscillator, improving work precision of the LC oscillator, and reducing the design difficulty of the LC oscillator.

The present invention will become more apparent from the following detailed description when taken in conjunction with the accompanying drawings used to illustrate embodiments of the invention.

DETAILED DESCRIPTION OF ILLUSTRATED EMBODIMENTS

Figure 1:
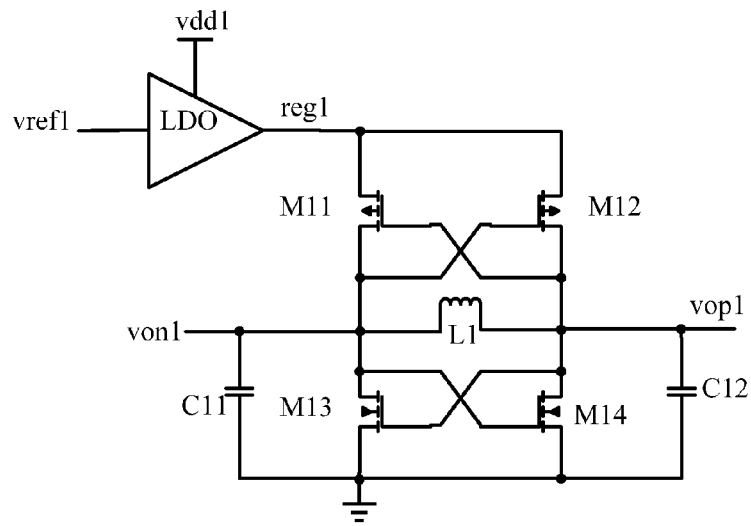
FIG. 1 is a frame diagram of the existing LC oscillator process compensation circuit.

Preferred embodiments of the present invention will be described taking in conjunction with the accompanying drawings below, and a similar component label in the drawings refers to a similar component. As noted above, the present invention provides an LC oscillator process compensation circuit which has simple circuit structure and eliminates the frequency changes of the LC oscillator caused by the process variations of the gain stage in the LC oscillator, thereby ensuring stability of the frequency of the LC oscillator, improving work precision of the LC oscillator, and reducing design difficulty of the LC oscillator.

Figure 2:
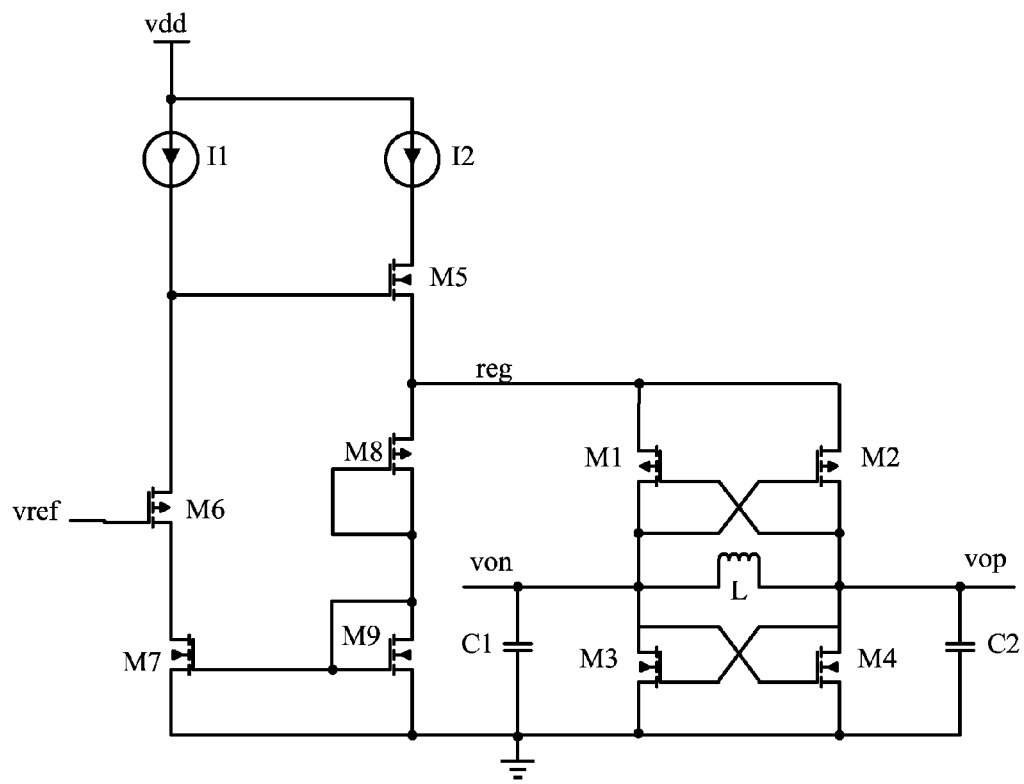
FIG. 2 is a frame diagram of the LC oscillator process compensation circuit according to the present invention.

Please refer to FIG. 2, FIG. 2 is a frame diagram of the LC oscillator process compensation circuit according to the present invention. As shown in FIG. 2, the LC oscillator process compensation circuit includes an LC oscillator, a reference voltage terminal, a follower and a current auxiliary circuit; the reference voltage terminal is arranged for generating a reference voltage vref; and the LC oscillator includes a gain stage, an inductor L and two voltage-controlled capacitors C1 and C2, the gain stage includes a first Field Effect Transistor (FET) M1, a second FET M2, a third FET M3 and a fourth FET M4, and the gain stage has two voltage output terminals to output voltages von and vop respectively and correspondingly when the LC oscillator process compensation circuit works normally, and each of the two voltage output terminals is connected with a voltage-controlled capacitor, and the inductor is connected between the two voltage output terminals(as shown in FIG. 2); the current auxiliary circuit is connected with an external power source vdd and the follower respectively, arranged for providing a working current needed by the follower, and the follower is also connected with the reference voltage terminal, arranged for providing a working voltage for the LC oscillator, and the follower further includes a detection circuit which is arranged for detecting current changes of the gain stage. To be noted, specific connections and functions of the components in the LC oscillator process compensation circuit are the same as the prior art, which are not described in detail.

Concretely, the follower includes a fifth FET M5, a sixth FET M6, a seventh FET M7 and the detection circuit; and a drain of the fifth FET M5 is connected with the current auxiliary circuit, a gate of the fifth FET M5 is connected with a source of the sixth FET M6, a source of the fifth FET M5 is connected with a drain of the first FET M1 and one terminal of the detection circuit respectively, a gate of the sixth FET M6 is connected with the reference voltage terminal, a drain of the sixth FET M6 is connected with a drain of the seventh FET M7, a source of the seventh FET M7 is grounded, a gate of the seventh FET M7 is connected with the detection circuit; the detection circuit includes an eighth FET M8 and a ninth FET M9, and a source of the eighth FET M8 is connected with the source of the fifth FET M5 and the drain of the first FET M1 respectively, gates and drains of the eighth FET M8 and the ninth FET M9 are jointly connected to the gate of the seventh FET M7, and a source of the ninth FET M9 is grounded; thus the current changes of the four FETs in the LC oscillator are detected by the eighth FET M8 and the ninth FET M9. Furthermore, in specific embodiments of the LC oscillator process compensation circuit, the third FET M3, the fourth FET M4, the fifth FET M5, the seventh FET M7 and the ninth FET M9 are N-type FETs; the first FET M1, the second FET M2, the sixth FET M6 and the eighth FET M8 are P-type FETs; and the width/length(W/L) ratio of the first FET M1 is the same as that of the second FET M2, the W/L ratio of the sixth FET M6 is the same as that of the eighth FET M8, and the W/L ratio of the sixth FET M6 is N times to that of the first FET M1; the W/L ratio of the third FET M3 is the same as that of the fourth FET M4, the W/L ratio of the ninth FET M9 is the same as that of the seventh M7 FET, and the W/L ratio of the ninth FET M9 is N times to that of the third FET M3; N is a positive integer, and the W/L ratio of the fifth FET M5 is the sum of the W/L ratio of the third FET M3, the fourth FET M4 and the ninth FET M9.

Furthermore, the current auxiliary circuit includes a first current source I1 and a second current source I2, and one terminal of the first current source I1 and the second current source I2 are connected with the external power source vdd, the other terminal of the first current source I1 is connected with the gate of the fifth FET M5 and the source of the sixth FET M6 respectively, the other terminal of the second current source I2 is connected with the drain of the fifth FET M5. Concretely, the first current source I1 and the second current source I2 provide the working current for the follower, wherein the current value of the first current source I1 changes with the bias current (namely the drain-source current of the seventh FET M7) of the sixth FET M6, and the current value of the second current source I2 changes with the drain-source current of the fifth FET M5.

In addition, in another preferred embodiment of the present invention, the current auxiliary circuit includes a first resistor and a second resistor which replace the first current source I1 and the second current source I2 respectively and correspondingly, and installation location and connection relationship of the first resistor and the second resistor are the same as that of the first current source I1 and the second current source I2. And by selecting appropriate resistances for the first resistor and the second resistor, function of the first current source I1 and the second current source I2 can be achieved.

Working process of the LC oscillator process compensation circuit according to the present invention is that, the follower changes with the reference voltage vref to obtain the working voltage reg of the LC oscillator, then the first current source I1 provides working current for the sixth FET M6 in the follower, the second current source I2 provides working current for the seventh FET M7 in the follower and provides working current for the LC oscillator through the drain of the fifth FET M5 at the same time. Meanwhile, the eighth FET M8 and the ninth FET M9 form a detection circuit for detecting the working current of the first FET M1, the second FET M2, the third FET M3 and the fourth FET M4. The seventh FET M7 and the ninth FET M9 form a mirror current amplifier to provide a bias current for the sixth FET M6. When the process of the N-type and P-type FETs in the gain stage changes, the detection circuit detects the current changes of the gain stage and feeds them back to the follower, and then the gate-source voltage of the sixth FET M6 and the gate-source voltage of the fifth FET M5 will be changed to compensate the changes of the voltage von and vop outputted from the two voltage output terminals caused by the gain stage, thus eliminates the frequency changes of the LC oscillator caused by the process variations of the gain stage in the LC oscillator, thereby ensuring stability of the frequency of the LC oscillator, improving work precision of the LC oscillator, and reducing design difficulty of the LC oscillator.

Working process of the LC oscillator process compensation circuit according to the present invention will be described following by combination with the FIG. 2.

The size of each FET is set as follows:

$$\left(\frac{W}{L}\right)_{PM1} = \left(\frac{W}{L}\right)_{PM2} = N \cdot \left(\frac{W}{L}\right)_{PM6} = N \cdot \left(\frac{W}{L}\right)_{PM8}$$

$$\left(\frac{W}{L}\right)_{NM3} = \left(\frac{W}{L}\right)_{NM4} = N \cdot \left(\frac{W}{L}\right)_{NM9} = N \cdot \left(\frac{W}{L}\right)_{NM7}$$

$$\left(\frac{W}{L}\right)_{NM5} = \left(\frac{W}{L}\right)_{NM3} + \left(\frac{W}{L}\right)_{NM4} + \left(\frac{W}{L}\right)_{NM9} = \left(2 + \frac{1}{N}\right) \cdot \left(\frac{W}{L}\right)_{NM3}$$

And:

$$\frac{\mu_p}{\mu_n} = \frac{\left(\frac{W}{L}\right)_{NM3}}{\left(\frac{W}{L}\right)_{PMS1}} = \frac{\left(\frac{W}{L}\right)_{NM4}}{\left(\frac{W}{L}\right)_{PM2}}$$

Then according to $$K = \mu \cdot C_{ox} \cdot \frac{W}{L},$$

can be seen:

$$K_{PM6} = \mu_p \cdot C_{ox} \cdot \left(\frac{W}{L}\right)_{PM6} = \frac{1}{N} \cdot \mu_p \cdot C_{ox} \cdot \left(\frac{W}{L}\right)_{PM1} = \frac{1}{N} \cdot K_{PM1}$$

$$K_{NM5} = \mu_n \cdot C_{ox} \cdot \left(\frac{W}{L}\right)_{NM5} = \left(2 + \frac{1}{N}\right) \cdot K_{NM3}$$

$$K_{PM1} = K_{NM3} = K_{PMS2} = K_{NM4}$$

From the circuit, it can be seen that the drain-source current of the fifth FET M5 is the sum of the drain-source current of the third FET M3, the fourth FET M4 and the ninth FET M9, the ninth FET M9 and the seventh FET M7 are mirror current amplifiers. And since the W/L ratio of the ninth FET M9 is the same to that of the seventh FET M7, and the gate-source voltage of the ninth FET M9 is the same to that of the seventh FET M7, thus the drain-source current of the ninth FET M9 is the same to that of the seventh FET M7. Moreover, the drain-source current of the seventh FET M7 is the same to that of the sixth FET M6 at the same time, so the drain-source currents of the ninth FET M9, the seventh FET M7 and the sixth FET M6 are the same. According to the current formula of the FETs:

$$I = \frac{1}{2} \cdot K(V_{GS} - V_{TH})^2,$$

it can be obtained:

$$I_{PM1} = I_{NM3} = \frac{1}{2} \cdot \mu_n \cdot C_{ox} \cdot \left(\frac{W}{L}\right)_{NM3} \cdot \left(\frac{reg}{2} - V_{THN}\right)$$

$$I_{PM2} = I_{NM4} = \frac{1}{2} \cdot \mu_n \cdot C_{ox} \cdot \left(\frac{W}{L}\right)_{NM4} \cdot \left(\frac{reg}{2} - V_{THN}\right)$$

$$I_{NM9} = \frac{1}{2} \cdot \mu_n \cdot C_{ox} \cdot \left(\frac{W}{L}\right)_{NM9} \cdot \left(\frac{reg}{2} - V_{THN}\right)$$

$$I_{NM5} = I_{NM3} + I_{NM4} + I_{NM9} = \left(2 + \frac{1}{N}\right) \cdot I_{NM3}$$

Further according to the W/L ratio of each FET, it can be obtained:

$$I_{PM6} = I_{NM7} = I_{NM9} = \frac{1}{N} \cdot I_{NM3} = \frac{1}{N} \cdot I_{PM1}$$

$$I_{NM5} = \left(\frac{1}{N} + 2\right) \cdot I_{NM3}$$

Then through $$I = \frac{1}{2} \cdot K(V_{GS} - V_{TH})^2, \quad V_{GS} = \sqrt{\frac{2 \cdot I}{K}} + V_{TH}$$

can be obtained, thus:

$$V_{GS\_PM6} = \sqrt{\frac{2 \cdot I_{PM6}}{K_{PM6}}} + V_{THP} = \sqrt{\frac{2 \cdot \frac{1}{N} \cdot I_{PM1}}{\frac{1}{N} K_{PM1}}} + V_{THP} = V_{GS\_PM1}$$

$$V_{GS\_NM5} = \sqrt{\frac{2 \cdot I_{NM5}}{K_{NM5}}} + V_{THN} = \sqrt{\frac{2 \cdot \left(\frac{1}{N} + 2\right) \cdot I_{NM3}}{\left(\frac{1}{N} + 2\right) \cdot K_{PM1}}} + V_{THN} = V_{GS\_NM3}$$

If the entire circuit works normally, the output voltage reg of the follower is:

$$reg = vref + V_{GS\_PM6} - V_{GS\_NM5} \quad (5)$$
$$= vref + V_{GS\_PM1} - V_{GS\_NM3}$$

-continued $$= vref + V_{THP} + \sqrt{\frac{2 \cdot I_{PM1}}{K_{PM1}}} - V_{THN} - \sqrt{\frac{2 \cdot I_{NM3}}{K_{NM3}}}$$

$$= vref + V_{THP} - V_{THN}$$

When calculating DC operating points, the resistance of the inductor L1 is very small, the two voltage output terminals von and vop are connected together, the first FET M1 and the second FET M2 are connected in parallel to form a diode connection, and the third FET M3 and the fourth FET M4 are connected in parallel to form a diode connection. During the normal work:

$$I_{PM1} = \frac{1}{2} \cdot K_{PM1}(V_{GS\_PM1}-V_{THP})^2; \quad (6)$$

$$I_{PM2} = \frac{1}{2} \cdot K_{PM2}(V_{GS\_PM2}-V_{THP})^2$$

$$I_{NM3} = \frac{1}{2} \cdot K_{NM3}(V_{GS\_NM3}-V_{THN})^2; \quad (7)$$

$$I_{NM4} = \frac{1}{2} \cdot K_{NM4}(V_{GS\_NM4}-V_{THN})^2$$

$$V_{GS\_PM1} + V_{GS\_NM3} = V_{GS\_PM2} + V_{GS\_NM4} = reg \quad (8)$$

$$I_{NM3} = I_{PM1};\ I_{NM4} = I_{PM2} \quad (9)$$

Put the formulas (6), (7), (8) into the formula (9), then we can get:

$$V_{GS\_NM3} = \frac{reg - V_{THP} + V_{THN} \cdot \sqrt{\frac{K_{NM3}}{K_{PM1}}}}{1 + \sqrt{\frac{K_{NM3}}{K_{PM1}}}} = \frac{reg - V_{THP} + V_{THN}}{2} \quad (10)$$

$$V_{GS\_NM4} = \frac{reg - V_{THP} + V_{THN} \cdot \sqrt{\frac{K_{NM4}}{K_{PM2}}}}{1 + \sqrt{\frac{K_{NM4}}{K_{PM2}}}} = \frac{reg - V_{THP} + V_{THN}}{2} \quad (11)$$

Further put the formula (5) into the formula (10) and the formula (11) respectively, then:

$$V_{GS\_NM3} = \frac{vref + V_{THP} + -V_{THN} - V_{THP} + V_{THN} \cdot \sqrt{\frac{K_{NM3}}{K_{PM1}}}}{1 + \sqrt{\frac{K_{NM3}}{K_{PM1}}}} = \frac{vref}{2} \quad (12)$$

$$V_{GS\_NM4} = \frac{vref + V_{THP} + -V_{THN} - V_{THP} + V_{THN} \cdot \sqrt{\frac{K_{NM4}}{K_{PM2}}}}{1 + \sqrt{\frac{K_{NM4}}{K_{PM2}}}} = \frac{vref}{2} \quad (13)$$

The voltage across the first capacitor C1 and across the second capacitor C2 (the voltage von and the voltage vop) are the $V_{GS\_NM3}$ and $V_{GS\_NM4}$ respectively. From the formula (12) and the formula (13), it can be seen that the voltage von and vop have no relationship with the process of the N-type and P-type FETs in the gain stage, which are only related to the reference voltage, more specifically equal to half of the reference voltage. Thus, in the process changing procedure, capacitance value of the first capacitor C1 and the second capacitor C2 will not change, that is the frequency of the LC oscillator will not be deviated.

While the present invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. An LC oscillator process compensation circuit, comprising:
   an LC oscillator, the LC oscillator comprising a gain stage, an inductor and two voltage-controlled capacitors, the gain stage comprising a first Field Effect Transistor, a second Field Effect Transistor, a third Field Effect Transistor and a fourth Field Effect Transistor, and the gain stage having two voltage output terminals each of which is connected with a voltage-controlled capacitor, and the inductor being connected between the two voltage output terminals;
   a reference voltage terminal;
   a follower, connected with the reference voltage terminal and arranged for providing a working voltage for the LC oscillator, and the follower further comprising a detection circuit which is arranged for detecting current changes of the gain stage; and
   a current auxiliary circuit, connected with an external power source and the follower respectively to provide a working current for the follower;
   wherein the follower comprises a fifth Field Effect Transistor, a sixth Field Effect Transistor, a seventh Field Effect Transistor and the detection circuit, and a drain of the fifth Field Effect Transistor is connected with the current auxiliary circuit, a gate of the fifth Field Effect Transistor is connected with a source of the sixth Field Effect Transistor, a source of the fifth Field Effect Transistor is connected with a drain of the first Field Effect Transistor and one terminal of the detection circuit respectively, a gate of the sixth Field Effect Transistor is connected with the reference voltage terminal, a drain of the sixth Field Effect Transistor is connected with a drain of the seventh Field Effect Transistor, a source of the seventh Field Effect Transistor is grounded, a gate of the seventh Field Effect Transistor is connected with the detection circuit, and the other terminal of the detection circuit is grounded.

2. The LC oscillator process compensation circuit according to claim 1, wherein the detection circuit comprises an eighth Field Effect Transistor and a ninth Field Effect Transistor, and a source of the eighth Field Effect Transistor is connected with the source of the fifth Field Effect Transistor and the drain of the first Field Effect Transistor respectively, gates and drains of the eighth Field Effect Transistor and the ninth Field Effect Transistor are jointly connected to the gate of the seventh Field Effect Transistor, and a source of the ninth Field Effect Transistor is grounded.

3. The LC oscillator process compensation circuit according to claim 2, wherein the third Field Effect Transistor, the fourth Field Effect Transistor, the fifth Field Effect Transistor, the seventh Field Effect Transistor, and the ninth Field Effect Transistor are N-type Field Effect Transistors; the first Field Effect Transistor, the second Field Effect Transistor, the sixth Field Effect Transistor and the eighth Field Effect Transistor are P-type Field Effect Transistors.

4. The LC oscillator process compensation circuit according to claim 3, wherein a width/length ratio of the first Field Effect Transistor is the same as that of the second Field Effect Transistor, the width/length ratio of the sixth Field Effect Transistor is the same as that of the eighth Field Effect Transistor, and the width/length ratio of the sixth Field Effect Transistor is N times to that of the first Field Effect Transistor; the width/length ratio of the third Field Effect Transistor is the same as that of the fourth Field Effect Transistor, the width/length ratio of the ninth Field Effect Transistor is the same as that of the seventh Field Effect Transistor, and the width/length ratio of the ninth Field Effect Transistor is N times to that of the third Field Effect Transistor, and N is a positive integer.

5. The LC oscillator process compensation circuit according to claim 4, wherein the width/length ratio of the fifth Field Effect Transistor is the sum of the width/length ratio of the third Field Effect Transistor, the fourth Field Effect Transistor and the ninth Field Effect Transistor.

6. The LC oscillator process compensation circuit according to claim 1, wherein the current auxiliary circuit comprises a first current source and a second current source, and one terminal of the first current source is connected with the external power source, the other terminal of the first current source is connected with the gate of the fifth Field Effect Transistor and the source of the sixth Field Effect Transistor respectively; one terminal of the second current source is connected with the external power source, and the other terminal of the second current source is connected with the drain of the fifth Field Effect Transistor.

7. The LC oscillator process compensation circuit according to claim 2, wherein the current auxiliary circuit comprises a first current source and a second current source, and one terminal of the first current source is connected with the external power source, the other terminal of the first current source is connected with the gate of the fifth Field Effect Transistor and the source of the sixth Field Effect Transistor respectively; one terminal of the second current source is connected with the external power source, and the other terminal of the second current source is connected with the drain of the fifth Field Effect Transistor.

8. The LC oscillator process compensation circuit according to claim 3, wherein the current auxiliary circuit comprises a first current source and a second current source, and one terminal of the first current source is connected with the external power source, the other terminal of the first current source is connected with the gate of the fifth Field Effect Transistor and the source of the sixth Field Effect Transistor respectively; one terminal of the second current source is connected with the external power source, and the other terminal of the second current source is connected with the drain of the fifth Field Effect Transistor.

9. The LC oscillator process compensation circuit according to claim 4, wherein the current auxiliary circuit comprises a first current source and a second current source, and one terminal of the first current source is connected with the external power source, the other terminal of the first current source is connected with the gate of the fifth Field Effect Transistor and the source of the sixth Field Effect Transistor respectively; one terminal of the second current source is connected with the external power source, and the other terminal of the second current source is connected with the drain of the fifth Field Effect Transistor.

10. The LC oscillator process compensation circuit according to claim 5, wherein the current auxiliary circuit comprises a first current source and a second current source, and one terminal of the first current source is connected with the external power source, the other terminal of the first current source is connected with the gate of the fifth Field Effect Transistor and the source of the sixth Field Effect Transistor respectively; one terminal of the second current source is connected with the external power source, and the other terminal of the second current source is connected with the drain of the fifth Field Effect Transistor.

11. The LC oscillator process compensation circuit according to claim 1, wherein the current auxiliary circuit comprises a first resistor and a second resistor, and one terminal of the first resistor is connected with the external power source, the other terminal of the first resistor is connected with the gate of the fifth Field Effect Transistor and the source of the sixth Field Effect Transistor respectively; one terminal of the second resistor is connected with the external power source, and the other terminal of the second resistor is connected with the drain of the fifth Field Effect Transistor.

12. The LC oscillator process compensation circuit according to claim 2, wherein the current auxiliary circuit comprises a first resistor and a second resistor, and one terminal of the first resistor is connected with the external power source, the other terminal of the first resistor is connected with the gate of the fifth Field Effect Transistor and the source of the sixth Field Effect Transistor respectively; one terminal of the second resistor is connected with the external power source, and the other terminal of the second resistor is connected with the drain of the fifth Field Effect Transistor.

13. The LC oscillator process compensation circuit according to claim 3, wherein the current auxiliary circuit comprises a first resistor and a second resistor, and one terminal of the first resistor is connected with the external power source, the other terminal of the first resistor is connected with the gate of the fifth Field Effect Transistor and the source of the sixth Field Effect Transistor respectively; one terminal of the second resistor is connected with the external power source, and the other terminal of the second resistor is connected with the drain of the fifth Field Effect Transistor.

14. The LC oscillator process compensation circuit according to claim 4, wherein the current auxiliary circuit comprises a first resistor and a second resistor, and one terminal of the first resistor is connected with the external power source, the other terminal of the first resistor is connected with the gate of the fifth Field Effect Transistor and the source of the sixth Field Effect Transistor respectively; one terminal of the second resistor is connected with the external power source, and the other terminal of the second resistor is connected with the drain of the fifth Field Effect Transistor.

15. The LC oscillator process compensation circuit according to claim 5, wherein the current auxiliary circuit comprises a first resistor and a second resistor, and one terminal of the first resistor is connected with the external power source, the other terminal of the first resistor is connected with the gate of the fifth Field Effect Transistor and the source of the sixth Field Effect Transistor respectively; one terminal of the second resistor is connected with the external power source, and the other terminal of the second resistor is connected with the drain of the fifth Field Effect Transistor.

* * * * *